(12) United States Patent
Ayres et al.

(10) Patent No.: US 10,446,535 B2
(45) Date of Patent: Oct. 15, 2019

(54) ROUTING FOR THREE-DIMENSIONAL INTEGRATED STRUCTURES

(71) Applicant: STMicroelectronics (Crolles 2) SAS, Crolles (FR)

(72) Inventors: Alexandre Ayres, Grenoble (FR); Bertrand Borot, Le Cheylas (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 22 days.

(21) Appl. No.: 15/137,201

(22) Filed: Apr. 25, 2016

(65) Prior Publication Data
US 2017/0179104 A1    Jun. 22, 2017

(30) Foreign Application Priority Data
Dec. 18, 2015    (FR) ...................................... 15 62785

(51) Int. Cl.
| | | |
|---|---|---|
| *H01L 23/48* | (2006.01) | |
| *H01L 27/02* | (2006.01) | |
| *G06F 17/50* | (2006.01) | |
| *H01L 23/522* | (2006.01) | |
| *H01L 23/528* | (2006.01) | |
| *H01L 23/532* | (2006.01) | |
| *H01L 27/088* | (2006.01) | |

(52) U.S. Cl.
CPC ...... *H01L 27/0207* (2013.01); *G06F 17/5068* (2013.01); *G06F 17/5077* (2013.01); *H01L 23/528* (2013.01); *H01L 23/5226* (2013.01); *H01L 23/53228* (2013.01); *H01L 27/088* (2013.01)

(58) Field of Classification Search
CPC ............... H01L 23/528; H01L 23/5226; H01L 23/53228; H01L 27/0207; H01L 27/088
See application file for complete search history.

(56) References Cited

U.S. PATENT DOCUMENTS

| | | | |
|---|---|---|---|
| 8,673,740 B2 * | 3/2014 | Cuzzocrea | H01L 21/76898 257/E21.008 |
| 2004/0098696 A1 | 5/2004 | Teig et al. | |
| 2013/0084687 A1 | 4/2013 | Cuzzocrea et al. | |
| 2015/0069523 A1 | 3/2015 | Or-Bach et al. | |
| 2015/0145116 A1 | 5/2015 | Uzoh et al. | |
| 2017/0200716 A1 * | 7/2017 | Or-Bach | H01L 23/544 |

OTHER PUBLICATIONS

DE Search Report and Written Opinion from co-pending DE Appl. No. 10-2016-109-652.0 dated Feb. 6, 2017 (14 pages).

(Continued)

*Primary Examiner* — Hoa B Trinh
(74) *Attorney, Agent, or Firm* — Crowe & Dunlevy

(57) ABSTRACT

A three-dimensional integrated structure is formed by a first substrate with first components oriented in a first direction and a second substrate with second components oriented in a second direction. An interconnection level includes electrically conducting tracks that run in a third direction. One of the second direction and third direction forms a non-right and non-zero angle with the first direction. An electrical link formed by at least one of the electrically conducting tracks electrically connected two points of the first or of the second components.

19 Claims, 5 Drawing Sheets

(56) References Cited

OTHER PUBLICATIONS

INPI Search Report and Written Opinion for FR 1562785 dated Aug. 12, 2016 (11 pages).
Cheng-Kok Koh et al: "Manhattan or Non-Manhattan?—A Study of Alternative VLSI Routing Architectures," ECE Technical Reports, Paper, Jan. 4, 1999, pp. 1-13, XP055294979.
Chia-Chun Tsai et al: "Double-Via Insertion Enhanced X-Architecture Clock Routing for Reliability," IEEE International Symposium on Circuits and Systems, ISCAS 2010—May 30, 2010 to Jun. 2, 2010, Paris, FR, IEEE, US, May 30, 2010, pp. 3413-3416, XP031725091.
Tong C C et al: "Routing in a Three-Dimensional Chip," IEEE Transactions on Computers, IEEE Service Center, Los Alamitos, CA, US, vol. 44, No. 1, Jan. 1, 1995, pp. 106-117, XP000526070.
Licheng Xue et al: "3D Floorplanning of Low-Power and Area-Efficient Network-on-Chip Architecture," Microprocessors and Microsystems, vol. 35, No. 5, Apr. 16, 2011, pp. 484-495, XP028224229.
Prasun Ghosal et al: "Obstacle Aware Routing in 3D Integrated Circuits," Dec. 16, 2011, Advanced Computing, Networking and Security, Springer Berlin Heidelberg, pp. 451-460, XP019175272.
First Office Action and Search Report for co-pending CN Appl. No. 201610355354.7 dated Oct. 10, 2018 (7 pages).

\* cited by examiner

ROUTING FOR THREE-DIMENSIONAL INTEGRATED STRUCTURES

PRIORITY CLAIM

This application claims priority from French Application for Patent No. 1562785 filed Dec. 18, 2015, the disclosure of which is incorporated by reference.

TECHNICAL FIELD

Various embodiments of the invention and their implementation relate to three-dimensional integrated structures, for example structures comprising individual chips rigidly attached together or else three-dimensional structures referred to as monolithic, in other words formed by successive stacking of various elements (substrates, interconnection part(s), etc.), and more particularly the routing of the interconnections between the various elements of such structures.

BACKGROUND

Conventionally, the components of an integrated circuit are interconnected by electrically conducting tracks which run in two preferential orthogonal directions. This type of routing is known by those skilled in the art as "Manhattan routing". This type of routing does not allow two components of the circuit situated obliquely to be connected "in a straight line", for example along a diagonal, with respect to one another, in the reference frame formed by the preferential orthogonal interconnection directions. The interconnection lengths, and hence the propagation times of the signals, are not optimal in all the directions of the circuit.

A routing allowing oblique, for example diagonal, interconnections would be desirable from the point of view of the performance characteristics of the circuit but is not compatible with the fabrication techniques for integrated circuits having a high density of integration.

SUMMARY

Thus, according to one embodiment, an integrated structure is provided comprising conducting tracks running in at least three different directions, and whose fabrication is carried out in a simple manner by conventional methods.

According to one aspect, a three-dimensional integrated structure is provided comprising at least a first substrate comprising first components oriented in at least a first direction (for example, lines of polysilicon forming gates of transistors or resistors, running in the first direction giving a first orientation to these transistors or to these resistances), a second substrate comprising second components oriented in at least a second direction and at least one interconnection level comprising electrically conducting tracks running in at least a third direction, the second direction and/or the third direction forming a non-right and non-zero angle with the first direction, in such a manner that two points of the first or of the second components are connected via a first electrical link comprising at least one of the electrically conducting tracks.

Thus, by using a three-dimensional integrated structure, a part of which is rotated by a non-zero and non-right angle with respect to another part of the structure, it becomes possible to form, in a simple manner, straight and oblique electrical links between two points, which is not possible with a conventional routing of the "Manhattan" type.

This is applicable whether the structure is of the monolithic type, or else formed of individual chips.

Thus, in the case of a monolithic structure, the two substrates may be angularly offset with the third direction parallel to the second direction, but for this reason angularly offset with respect to the first direction.

As a variant, the two substrates may not be angularly offset, but in this case it is the interconnection level which is angularly offset with respect to the two substrates.

It is of course possible to provide at least one level of interconnections on top of each substrate, with for example the assembly "second substrate-associated interconnection level" angularly offset with respect to the assembly "first substrate-associated interconnection level".

In the case of individual chips, a first chip could contain the first substrate and a first interconnection part, a second chip could contain the second substrate and a second interconnection part, and the two chips would be angularly offset when they are assembled.

Preferably, the non-right and non-zero angle is an angle of 45°.

According to one variant of the "individual chips" type, the integrated structure can comprise at least a first element, for example a first chip, comprising the first substrate and at least a first interconnection level containing first electrically conducting tracks running at least in a fourth direction parallel or orthogonal to the first direction, and a second element, for example a second chip, comprising at least the second substrate and at least a second interconnection level containing second electrically conducting tracks running in the at least a third direction of orientation.

The two elements are rigidly attached together, and
the second direction forms the non-right and non-zero angle with the first direction, the third direction is parallel or orthogonal to the second direction, and at least two points of the first element are electrically connected by the first electrical link comprising at least one of the second electrically conducting tracks.

Thus, the structure provided comprises two elements the routing of whose interconnections is formed in a conventional manner, for example a routing referred to as "Manhattan routing", and the two elements are rigidly attached in such a manner that the structure comprises metal tracks which run in the three directions including one oblique direction with respect to the other two, which allows a reduction in the length of the tracks with respect to a structure only comprising two preferential routing directions.

In other words, at least one of the second tracks belonging to the at least one interconnection level of the second chip is used to electrically connect two points of the first chip in an oblique manner.

The first electrically conducting tracks can run, generally speaking, in the fourth and/or a fifth orthogonal direction, and the second metal tracks can run in the third and/or a sixth orthogonal direction.

Each element may comprise an interconnection part, for example an interconnection part of the BEOL (Back End Of Line) type, according to an acronym well known to those skilled in the art, comprising several metal levels and the at least one interconnection level of the element in question is at least one metal level of the interconnection part.

The first electrical link may comprise vias connecting the two points to the at least a second electrically conducting track.

The first element and the second element may be rigidly attached together by electrically conducting pillars, or by a hybrid bonding via their respective interconnection parts.

At least one of the two elements may comprise at least one integrated circuit, for example formed within its substrate.

At least two points of the second element may also be electrically connected by a second electrical link comprising at least one of the first electrically conducting tracks forming the non-right and non-zero angle with the second electrically conducting tracks of the at least a second interconnection level.

In other words, this consists here of a dual structure in which, for example, two components of the first element can be connected via an oblique link situated at the level of the second element and vice versa.

According to another variant, the integrated structure may be a three-dimensional monolithic structure comprising at least the first substrate, the second substrate and the at least one interconnection level.

For example, the first and second directions may be parallel and the third direction forms the non-right and non-zero angle with the first and the second directions.

As a variant, the second direction and the third direction can be parallel and form, with the first direction, the non-right and non-zero angle.

In this embodiment, two points of the first substrate may be connected by an electrical link comprising one of the electrically conducting tracks of the at least one interconnection level.

The monolithic integrated structure may also comprise at least one additional interconnection level between the first substrate and the second substrate and two points of the additional interconnection level may be connected by a second electrical link comprising a second electrically conducting track of a second interconnection level running in at least the third direction.

According to another aspect, a method is provided for fabricating a three-dimensional integrated structure comprising
  the formation of at least a first substrate comprising first components oriented in at least a first direction,
  the formation of a second substrate comprising second components oriented in at least a second direction, and
  the formation of at least one interconnection level comprising electrically conducting tracks running in at least a third direction,
the first substrate, the second substrate and the at least one interconnection level being rigidly attached together such that the second direction and/or the third direction form a non-right and non-zero angle with the first direction and that two points of the first or of the second components are connected by a first electrical link comprising at least one of the electrically conducting tracks.

Preferably, the non-right and non-zero angle is an angle of 45°.

According to one embodiment, the method may comprise
  the formation of at least a first element comprising the first substrate and at least a first interconnection level containing first electrically conducting tracks running at least in a fourth direction parallel or orthogonal to the first direction,
  the formation of a second element comprising at least the second substrate and at least a second interconnection level containing second electrically conducting tracks running in the at least a third direction of orientation
  the rigid attachment of the two elements after a rotation of one of the elements with respect to the other by the non-right and non-zero angle, in such a manner that the second direction forms the non-right and non-zero angle with the first direction, the third direction being parallel or orthogonal to the second direction,
  a first electrical link comprising at least one of the second electrically conducting tracks electrically connecting at least two points of the first element.

According to another embodiment, the method may comprise the formation of a monolithic integrated structure comprising at least the first substrate, the second substrate and the at least one interconnection level assembled together.

The second and the third direction may be parallel and form the non-right and non-zero angle with the first direction.

The method may furthermore comprise the formation of an electrically conducting link comprising one of the electrically conducting tracks of the interconnection level and connecting two points of the first substrate.

The method may also comprise the formation of at least one additional interconnection level between the first substrate and the second substrate and the formation of a second electrical link comprising a second electrically conducting track of a second interconnection level running in at least the third direction, the second electrical link connecting two points of the first additional interconnection level.

The placement/routing of the various components and electrically conducting tracks is advantageously implemented by taking into account the rotation by a non-right and non-zero angle.

BRIEF DESCRIPTION OF THE DRAWINGS

Other advantages and features of the invention will become apparent upon examining the detailed description of embodiments and their implementation and the figures in which.

DETAILED DESCRIPTION

Figure 1:
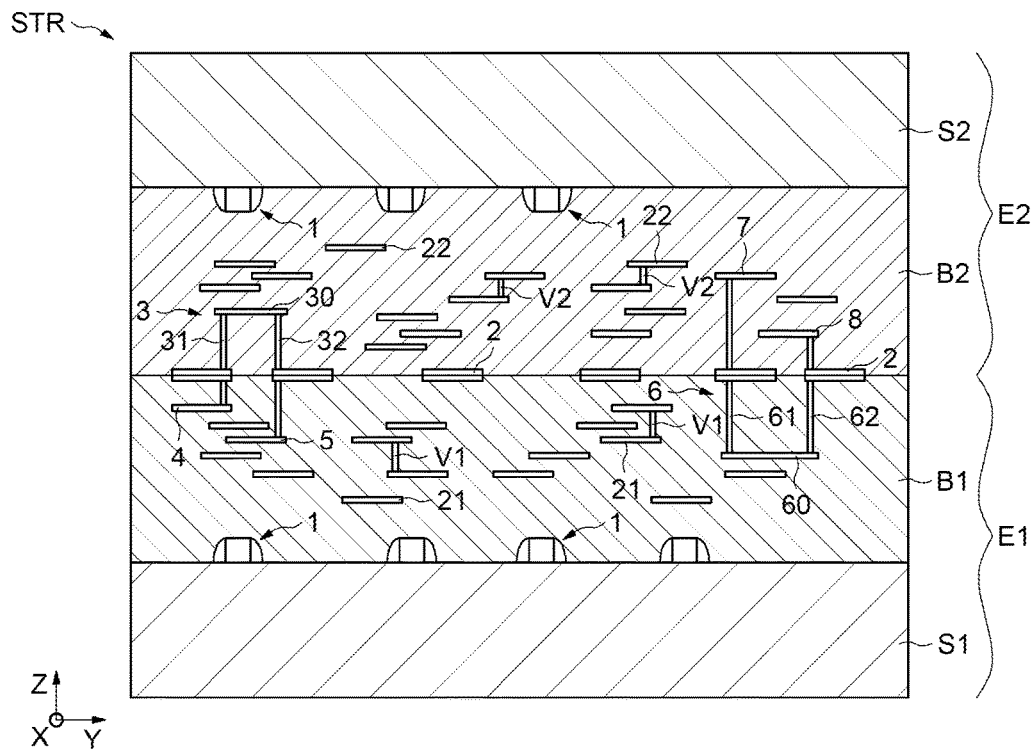
FIGS. 1 to 9 illustrate aspects of a three-dimensional integrated structure.
Figure 2:
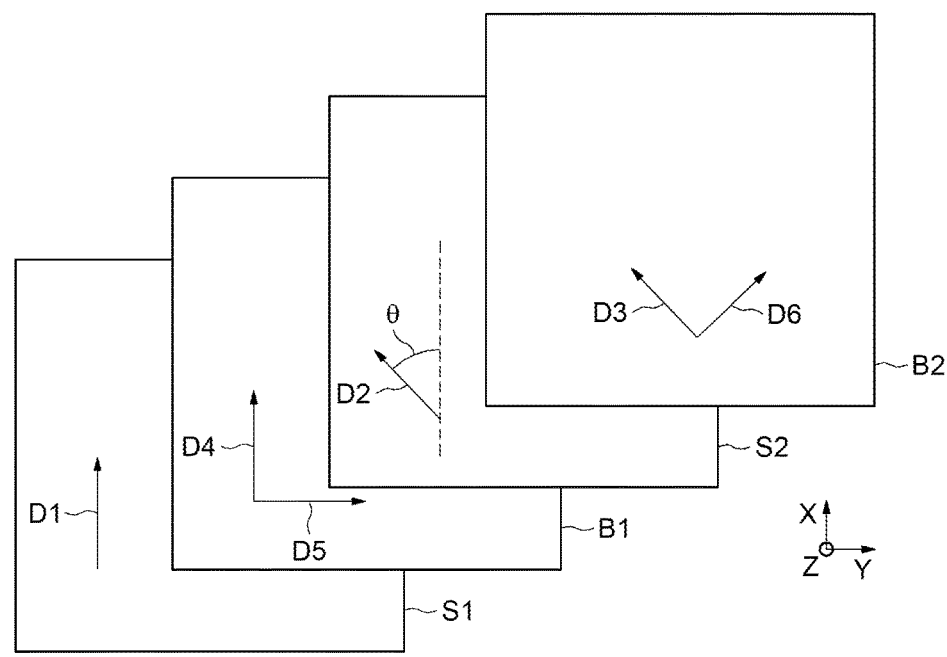

FIGS. 1 and 2 illustrate a three-dimensional integrated structure STR comprising a first element E1, for example a first chip, and a second element E2, for example a second chip. The structure STR is therefore of the "individual chips" type.

The first element E1 comprises a first substrate S1, and a first interconnection part B1 (commonly denoted by those skilled in the art using the acronym BEOL for Back End Of Line) comprising several interconnection levels (metal levels) which each comprise electrically conducting tracks, for example first metal tracks 21, and levels of vias V1 between these metal levels.

The second element E2 comprises a second substrate S2 and a second interconnection part B2 comprising second metal tracks 22, and levels of vias V2 between these metal levels.

The two elements E1 and E2 each comprise a plurality of components 1 formed within and/or on their respective substrates S1 and S2, for example transistors.

As illustrated in FIG. 2, the components of the first substrate S1 are oriented in at least a first preferential direction D1. In this example, the direction D1 is collinear with the axis X. Thus, the lines of polysilicon forming the gates of the transistors 1 run in the first direction D1.

However, some transistors may have gates extending, for the most part, in the preferential direction and having short sections connecting perpendicularly the part oriented in the preferential direction so as to form for example gates having a 'T', 'U' or 'E' shape. Nevertheless, despite these gate appendages, the components will be considered as oriented in the first preferential direction D1.

The components of the second substrate are oriented in a second preferential direction D2, for example here a direction having a component along the X axis and a component along the Y axis, in such a manner that the second direction forms a non-right and non-zero angle θ with the first direction, for example an angle θ of 45°.

The metal tracks 21 of the first interconnection part B1 run in a fourth direction D4, here collinear with the first direction D1, and in a fifth direction D5 orthogonal to the fourth direction D4.

The metal tracks 22 of the second interconnection part B2 run in a third direction D3, here collinear with the second direction D2 and in a sixth direction D6, orthogonal to the third direction D3.

The two elements E1 and E2 comprise metal lugs 2 on their respective interconnection parts which rigidify the integrated structure by a metal-metal bonding, an insulator-insulator bonding being obtained by portions located between the metal lugs. The metal lugs 2 are accordingly formed by the bonding of two portions of upper metal tracks belonging to the first and second interconnection parts B1 and B2. This type of bonding, of the molecular type, is commonly denoted by the term "hybrid bonding".

The integrated structure STR comprises a first electrical link 3 connecting two points 4 and 5 of the first element E1 and comprising a metal track 30 of the second interconnection part B2. Here, the two points each belong to a different metal track of the first interconnection part B1.

The two points 4 and 5 are connected to the metal track 30 by means of two vias 31 and 32.

A second electrical link 6 comprising a second metal track 60 connects, in this example, two points 7 and 8 of the second interconnection level B2, by means of two vias 61 and 62.

Thus, a metal track 30 of the second interconnection part B2 has been used to form a diagonal or oblique link between the two points 4 and 5 of the first interconnection part B1. It should be noted that the metal track 30 may not be electrically connected to any other metal track of the second interconnection level B2 and is therefore only used to form an electrical link between the two points 4 and 5 of the first element E1. If needed, the metal track 30 may be used to electrically connect two points 4 and 5 of the first element E1 to each other but also to another point of the second element E2.

Similarly, a metal track 60 of the first interconnection part B1 has been used to form a diagonal or oblique link between the two points 7 and 8 of the second interconnection part B2.

During the process of forming such a structure, each of the elements E1 and E2 is formed in a conventional manner, and the rigid attachment of the two elements is done after rotation by 45° of one of the two elements with respect to the other.

Furthermore, the formation of each of the vias 31, 32, 61, and 62 is carried out in two parts. A first segment of each via is formed in the first element, and a second segment is formed in the second element. Each segment of via extends from a bonding lug 2 situated on the upper face of the interconnection part in which it is located, facing the associated second segment. The two segments of each via are assembled in such a manner as to form one and the same via when the first element and the second element are bonded together.

Thus, the electrical links 3 and 6 are only formed at the time of the bonding of the two elements E1 and E2. The placement/routing of the first element E1 has been carried out taking into account the placement/routing of the second element E2, and/or vice versa.

It should be noted that FIG. 1 is not a true cross-sectional view but a schematic simplified view of the electrical links described hereinabove. The points 4 and 5 of the first element E1 are not situated in the same plane parallel to the plane of the figure but are offset with respect to one another along the X axis.

Similarly, the two segments of the via 31 and the pair of bonding lugs from which they run are offset along the X axis with respect to the two segments of the via 31 and to the pair of bonding lugs from which they run.

The same remarks may be applied to the points 7 and 8 and to the elements included in the link 6.

Figure 3:
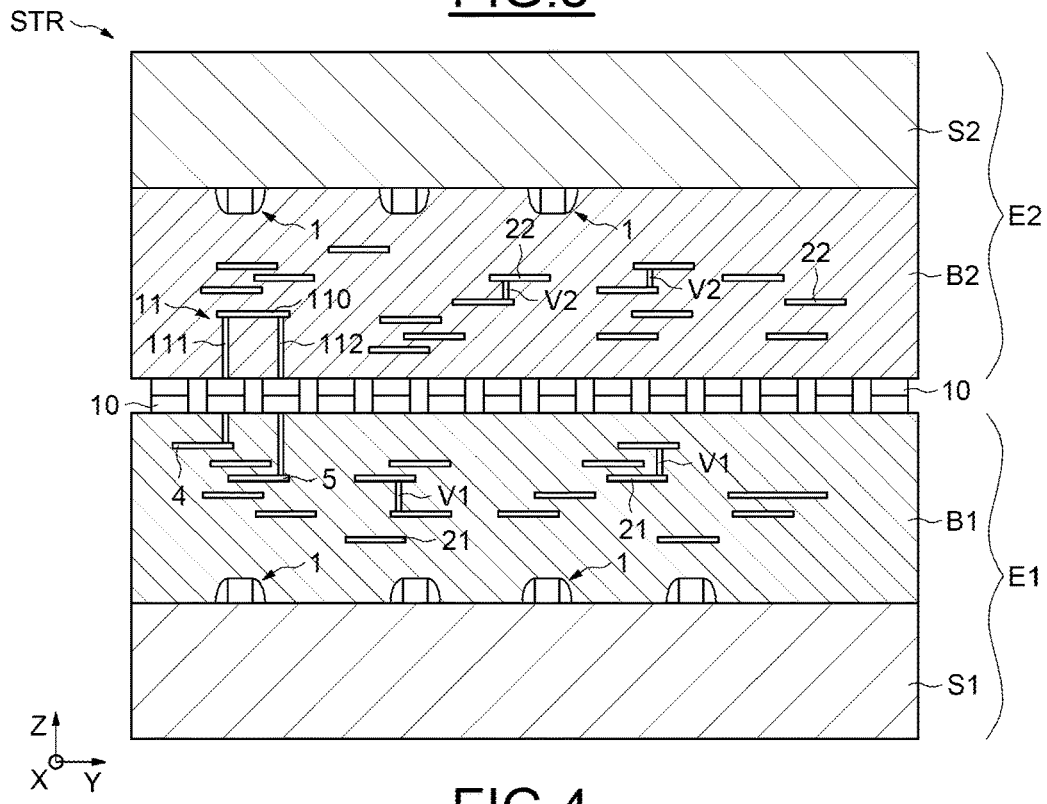

According to another embodiment illustrated in FIG. 3, each interconnection part comprises electrically conducting pillars 10 on its upper face, for example pillars of copper 10, and the two elements E1 and E2 are rigidly attached together by means of these pillars.

The structure STR also comprises an electrical link 11 connecting two points 4 and 5 of the first element.

The electrical link comprises two vias 111 and 112 and a second metal track 110 of the second interconnection part B2. Each segment of each via here runs from a pillar of copper, and the electrical link 11 is only formed at the time of the rigid attachment of two elements E1 and E2 via their respective pillars of copper 10.

Figure 4:
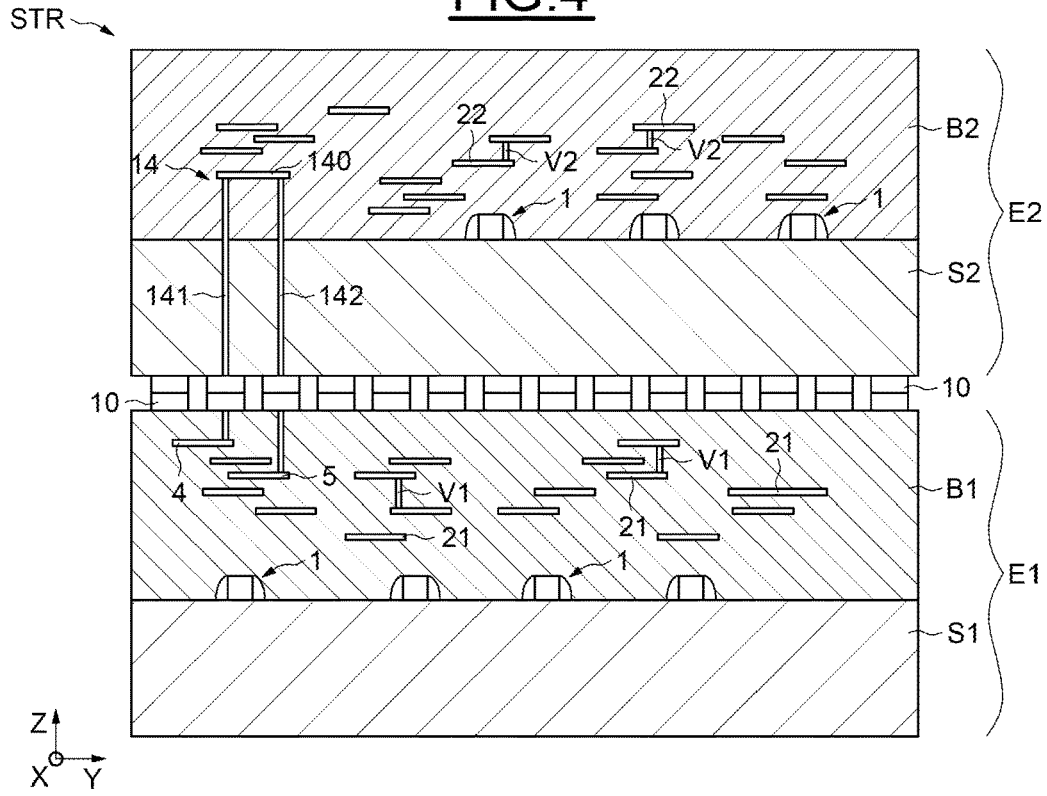

As illustrated in FIG. 4, one of the two elements, for example the second element E2, may comprise the pillars of copper 10 on the lower face of its substrate S2, rather than on the upper face of its interconnection part B2.

An electrical link 14 connecting the two points 4 and 5 of the first element thus comprises vias 141 and 142 a part of which, known by those skilled in the art under the acronym TSV (for Through Silicon Via), extends into the second element from the pillars of copper 10, passing through the second substrate S2 as far as the metal track 140 present in the second interconnection level.

It should be noted that the electrical link 14 extends into a part of the second substrate S2 not comprising any component.

Here again, the electrical link 14 is only formed at the time of the rigid attachment of the two elements E1 and E2 by means of the copper pillars 10.

Figure 5:
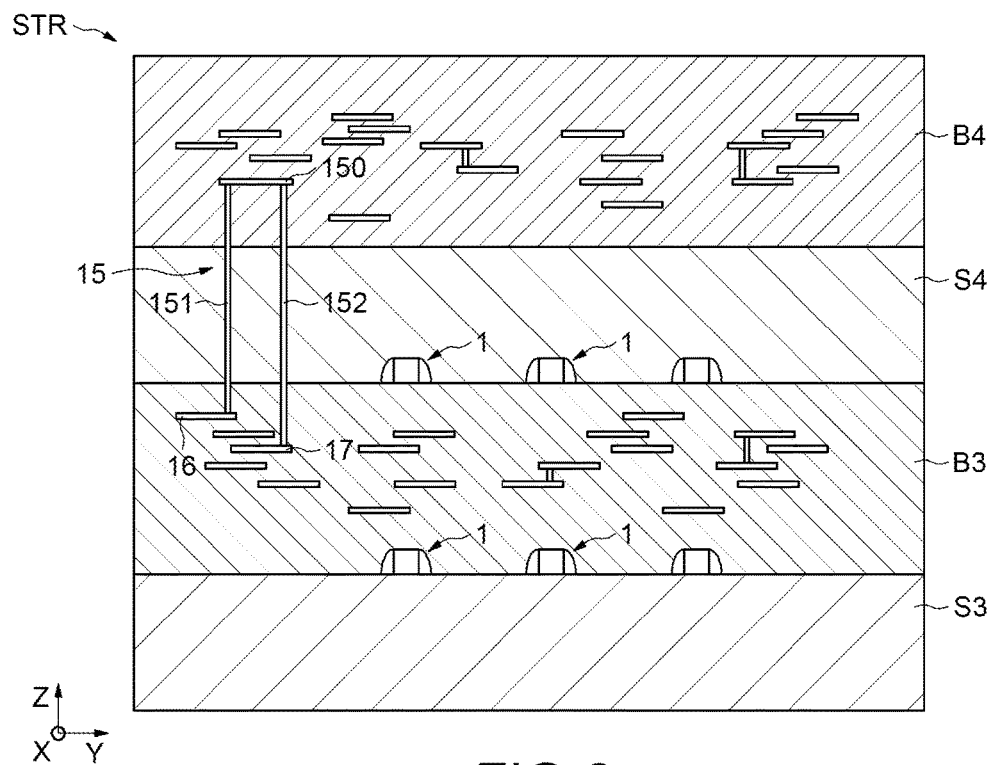

According to another aspect illustrated in FIG. 5, the integrated structure may be a monolithic structure comprising the stacking of a first substrate S3, of a first interconnection part B3, of the second substrate S4, and of a second interconnection part B4.

In contrast to the preceding embodiments, the structure STR is not obtained by the rigid attachment of two elements formed separately, but by the superposition of the various layers S3, B3, S4, B4.

The monolithic structure is formed in a conventional manner by the successive and superposed formation of the layers S3, B3, S4 and B4, performing a rotation by an angle θ of 45° between the formation of the first interconnection part B3 and the formation of the second substrate S4.

Figure 6:
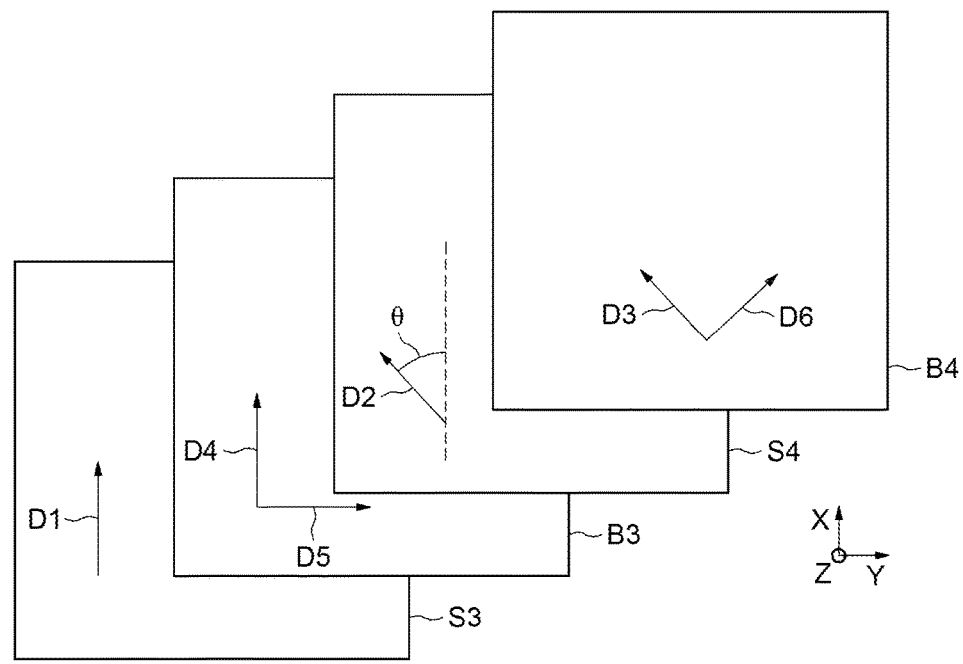

Thus, as illustrated in FIG. 6, the components 1 of the first substrate S3 are oriented in the first preferential direction D1 which in this example is collinear with the axis X.

The components of the second substrate S4 are oriented in the second preferential direction D2, here comprising a component along the X axis and a component along the Y axis, so as to form the angle θ of 45° with the first direction D1.

The metal tracks of the first interconnection part B3 run in the fourth direction D4 and in the fifth direction D5, orthogonal to the fourth direction D4. Here, the fourth direction D4 is collinear with the first direction D1.

The metal tracks of the second interconnection part B4 run in the third direction D3 and in the sixth direction D6, orthogonal to the third direction D3. In this example, the third direction comprises a component along the X axis and a component along the Y axis, in such a manner as to form the non-right and non-zero angle θ with the first direction, for example here an angle θ of 45°.

The monolithic structure STR comprises an electrical link 15 connecting two points 16 and 17 of the first interconnection part B3 and comprising a metal track 150 of the second interconnection part B4.

The two points are connected to the metal track 150 by vias 151 and 152 formed according to a conventional method.

Thus, a metal track 150 of the second interconnection part B4 has been used to form a diagonal or oblique link between the two points 16 and 17 of the first interconnection part B3.

Figure 7:
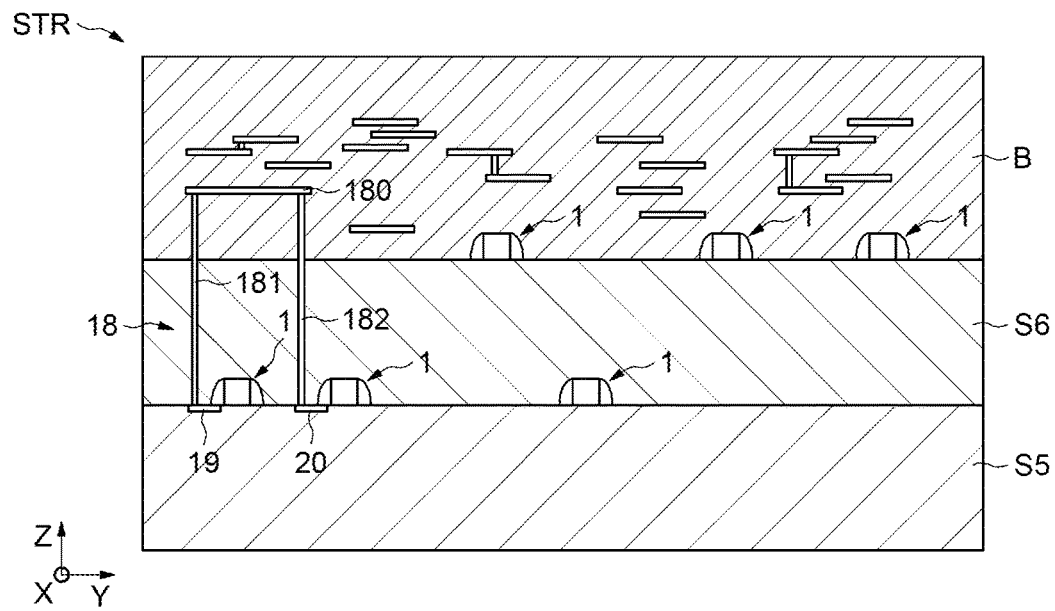

According to one variant illustrated in FIG. 7, the monolithic structure may comprise the stacking of a first substrate S5, of the second substrate S6, and of an interconnection part B.

In this variant, the structure STR is formed in a conventional manner by the successive and superposed formation of the layers S5, S6, and part B, performing a rotation by an angle θ of 45° between the formation of the second substrate S6 and of the interconnection part B.

The structure furthermore comprises an electrical link 18 connecting two points 19 and 20 of the first substrate S5, for example two electrodes of two transistors 1 formed within the first substrate S5, and comprising a metal track 180 of the interconnection level S1.

The two points 181 and 182 are connected to the metal track 180 by vias 181 and 182 which pass through a part of the second substrate S4 not comprising any component.

Figure 8:
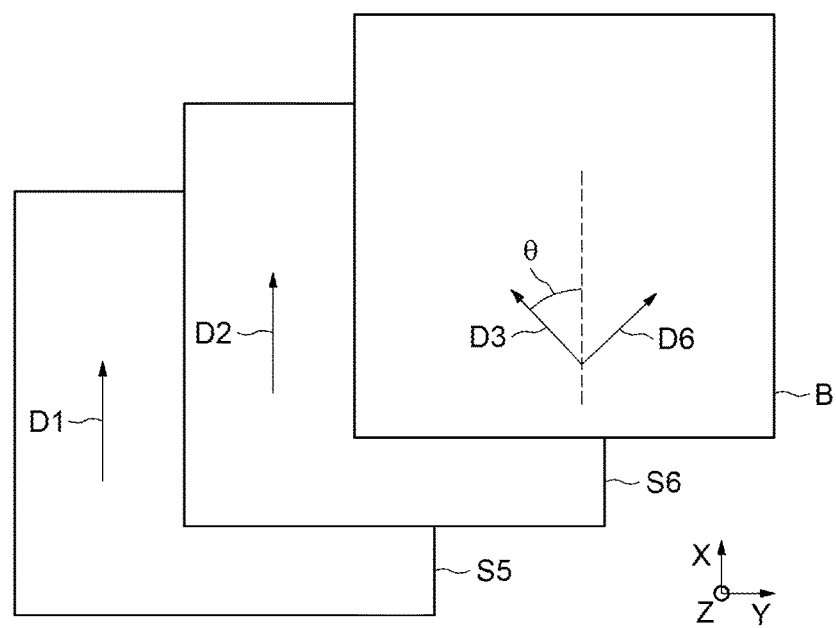

As illustrated in FIG. 8, the components of the first substrate S5 are oriented in the first preferential direction D1, and the components of the second substrate S6 are oriented in the second preferential direction D2. Here, the first preferential direction and the second preferential direction are collinear, oriented along the axis X. Thus, the lines of polysilicon forming the gates of the transistors 1 run in the first direction.

The metal tracks of the interconnection part B are oriented in the third preferential direction D3 and the sixth preferential direction D6, orthogonal to the second preferential direction D2.

In this example, the third preferential direction D3 runs in a direction comprising a component along the X axis and a component along the Y axis, in such a manner as to form the non-right and non-zero angle θ with the first direction, for example here an angle θ of 45°.

Thus, a metal track 180 of the interconnection part B has been used to form a diagonal or oblique link between the two points 19 and 20 of the first substrate.

Figure 9:
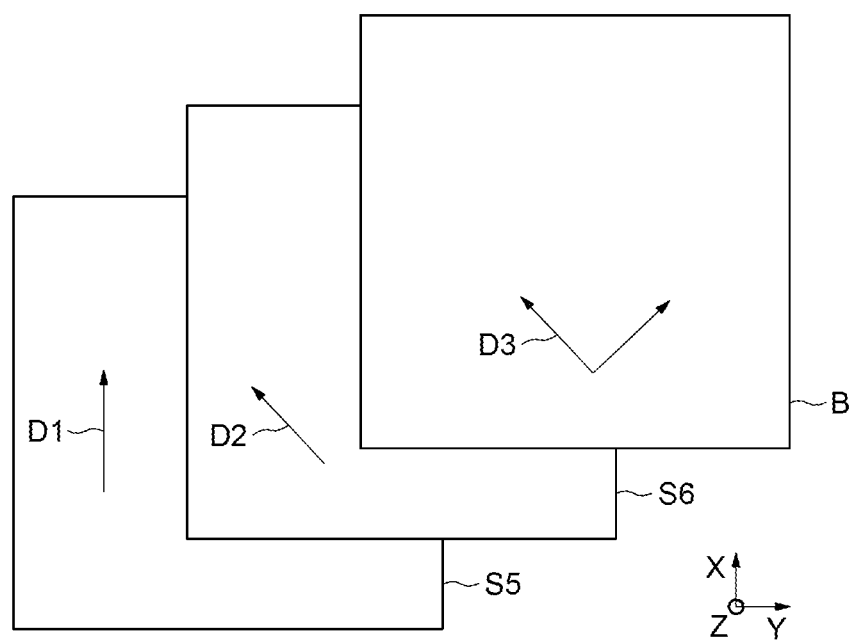

According to one variant illustrated in FIG. 9, the structure STR is formed in a conventional manner by the successive and superposed formation of the layers S5, S6, and part B, performing a rotation by an angle θ of 45° between the formation of the first substrate S5 and the formation of the second substrate S6.

Thus, the first direction D1 extends along the axis X, and the second direction and the third direction are collinear and comprise a component along the X axis and a component along the Y axis, in such a manner as to form the angle θ of 45° with the first direction D1.

The embodiments and their implementations presented here are non-limiting. Notably, although the non-right and non-zero angle here had a value of 45°, the embodiments and their implementations presented here are compatible with any value of angle.

Furthermore, in the variants of structures of the "individual chips" type, it would be possible to provide a structure of the "back-to-back" type according to an expression well known to those skilled in the art, in other words a structure in which the substrates S1 and S2 of the two elements E1 and E2 are rigidly attached by their back face, in other words their face opposite to that carrying the interconnection part (BEOL).

The invention is also applicable to a three-dimensional structure obtained by a technology known as a "bonding and/or sequentially built structure" using for example 'seed windows' for promoting the growth of crystalline portions of silicon in a top part of the structure, or else depositions of films of silicon followed by crystallizations.

The invention claimed is:

1. A three-dimensional integrated structure, comprising:
a first substrate having a peripheral edge in a shape which includes four sides and four right angles, the first substrate including a plurality of first transistors having gate lines which extend parallel to each other and are oriented in a first direction that is parallel to a side of the shape of the first substrate,
a first interconnection level over the first substrate and which includes first electrically conducting tracks extending in directions parallel to the four sides of the shape of the first substrate,
a second substrate having a peripheral edge in a shape which includes four sides and four right angles, the second substrate including a plurality of second transistors having gate lines which extend parallel to each other and are oriented in a second direction which makes a non-right and non-zero angle with a side of the shape of the second substrate,
a second interconnection level over the second substrate and which includes second electrically conducting tracks extending directions parallel to and orthogonal to the second direction, and
wherein the first and second interconnection levels face each other and electric connections are present between ones of the first and second electrically conducting tracks.

2. The structure according to claim 1, wherein the non-right and non-zero angle is an angle of 45°.

3. The structure according to claim 1, wherein each of the first and second interconnection levels includes a plurality of metallization levels, each metallization level containing electrically conducting tracks.

4. The structure according to claim 1, wherein the four sides of the shape of the first substrate extend parallel corresponding ones of the four sides of the shape of the second substrate.

5. The structure according to claim 1, wherein the four sides of the shape of the first substrate are aligned with corresponding ones of the four sides of the shape of the second substrate.

6. The structure according to claim 1, wherein the electric connections between ones of the first and second electrically conducting tracks comprise electrically conducting pillars.

7. The structure according to claim 1, wherein the electric connections between ones of the first and second electrically conducting tracks comprise hybrid bondings.

8. A three-dimensional integrated structure, comprising:
a first substrate having a peripheral edge in a shape which includes four sides and four right angles, the first substrate including a plurality of first transistors having gate lines which extend parallel to each other and are oriented in a first direction that is parallel to a side of the shape of the first substrate,
a first interconnection level over the first substrate and which includes first electrically conducting tracks extending in directions parallel to the four sides of the shape of the first substrate,
a second substrate having a peripheral edge in a shape which includes four sides and four right angles, the second substrate including a plurality of second transistors having gate lines which extend parallel to each other and are oriented in a second direction which makes a non-right and non-zero angle with a side of the shape of the second substrate,
a second interconnection level over the second substrate and which includes second electrically conducting tracks extending directions parallel to and orthogonal to the second direction, and
wherein the first interconnection level faces a bottom surface of the second substrate and electric connections are present between ones of the first and second electrically conducting tracks.

9. The structure according to claim 8, wherein the non-right and non-zero angle is an angle of 45°.

10. The structure according to claim 8, wherein each of the first and second interconnection levels includes a plurality of metallization levels, each metallization level containing electrically conducting tracks.

11. The structure according to claim 8, wherein the four sides of the shape of the first substrate extend parallel corresponding ones of the four sides of the shape of the second substrate.

12. The structure according to claim 8, wherein the four sides of the shape of the first substrate are aligned with corresponding ones of the four sides of the shape of the second substrate.

13. The structure according to claim 8, wherein the electric connections between ones of the first and second electrically conducting tracks comprise through silicon vias which extend through the second substrate.

14. A three-dimensional integrated structure, comprising:
a first substrate having a peripheral edge in a shape which includes four sides and four right angles, the first substrate including a plurality of first transistors having gate lines which extend parallel to each other and are oriented in a first direction that is parallel to a side of the shape of the first substrate,
an interconnection level over the first substrate and which includes electrically conducting tracks extending in directions parallel to the four sides of the shape of the first substrate,
a second substrate having a peripheral edge in a shape which includes four sides and four right angles, the second substrate including a plurality of second transistors having gate lines which extend parallel to each other and are oriented in a second direction which makes a non-right and non-zero angle with a side of the shape of the second substrate, and
wherein the second substrate faces a bottom surface of the first substrate and electric connections are present between the second transistors and the electrically conducting tracks.

15. The structure according to claim 14, wherein the non-right and non-zero angle is an angle of 45°.

16. The structure according to claim 14, wherein the interconnection level includes a plurality of metallization levels, each metallization level containing electrically conducting tracks.

17. The structure according to claim 14, wherein the four sides of the shape of the first substrate extend parallel corresponding ones of the four sides of the shape of the second substrate.

18. The structure according to claim 14, wherein the four sides of the shape of the first substrate are aligned with corresponding ones of the four sides of the shape of the second substrate.

19. The structure according to claim 14, wherein the electric connections between the second transistors and the electrically conducting tracks comprise through silicon vias which extend through the first substrate.

* * * * *